United States Patent [19]

Perer et al.

[11] Patent Number: 5,367,183

[45] Date of Patent: Nov. 22, 1994

[54] SEMICONDUCTOR DEVICE WITH COMPLEMENTARY TRANSISTORS

[75] Inventors: Ernesto Perea, Gif sur Yvette; Daniel Delagebeaudeuf, Saclay, both of France

[73] Assignee: Thomson-CSF Semiconducteurs Specifiques, Puteaux, France

[21] Appl. No.: 43,558

[22] Filed: Apr. 7, 1993

[30] Foreign Application Priority Data

Apr. 7, 1992 [FR] France ................... 92 04216

[51] Int. Cl.$^5$ ............... H01L 29/80; H01L 29/205
[52] U.S. Cl. ................... 257/194; 257/195; 257/274
[58] Field of Search ............ 257/192, 194, 287, 285, 257/280, 195, 274

[56] References Cited

U.S. PATENT DOCUMENTS

| | | | |
|---|---|---|---|
| 3,992,715 | 11/1976 | Delagebeaudeuf et al. | 357/13 |
| 4,176,366 | 11/1979 | Delagebeaudeuf et al. | 257/199 |
| 4,186,407 | 1/1980 | Delagebeuadeuf et al. | 257/199 |
| 4,455,564 | 6/1984 | Delagebeaudeuf et al. | 257/194 |
| 4,568,843 | 2/1986 | Gloanee et al. | 307/291 |
| 4,780,748 | 10/1988 | Cunningham et al. | 257/728 |
| 4,830,980 | 5/1989 | Hsieh | 257/283 |
| 4,872,049 | 10/1989 | Derewonko et al. | 357/728 |
| 4,974,038 | 11/1990 | Delagebeaudeuf et al. | 257/192 |
| 4,994,868 | 2/1991 | Geissberger et al. | 257/192 |
| 5,031,012 | 7/1991 | Cunningham et al. | 257/80 |
| 5,043,607 | 8/1991 | Danckaert et al. | 307/450 |
| 5,045,727 | 9/1991 | Danckaert et al. | 307/362 |
| 5,060,234 | 10/1991 | Schubert et al. | 257/21 |
| 5,068,756 | 11/1991 | Morris et al. | 257/192 |
| 5,093,695 | 3/1992 | Cunningham et al. | 257/184 |
| 5,130,766 | 7/1992 | Arimoto et al. | 257/287 |
| 5,144,379 | 9/1992 | Eshita et al. | 257/194 |
| 5,151,758 | 9/1992 | Smith | 257/287 |
| 5,216,260 | 6/1993 | Schubert et al. | 257/280 |
| 5,223,724 | 6/1993 | Green, Jr. | 257/280 |
| 5,254,863 | 10/1993 | Battersby | 257/280 |

FOREIGN PATENT DOCUMENTS

| | | |
|---|---|---|
| 0114962 | 8/1984 | European Pat. Off. |
| 0256363 | 2/1988 | European Pat. Off. |
| 0312237 | 4/1989 | European Pat. Off. |

OTHER PUBLICATIONS

IEEE Transactions on Electron Devices, vol. Ed.-33, No. 5, May 1986, "The Delta-Doped Field-Effect Transistor (FET)", E. F. Schubert, A. Fischer & K. Ploog.

Japanese Journal of Applied Physics, vol. 24, No. 8, Aug. 1985, pp. L608-L610, "The $\epsilon$-Doped F Field Effect Transistor", E. F. Schubert and K. Ploog.

Patent Abstracts of Japan, vol. 11, No. 208 (E-542)(2735) Sep. 17, 1987 & JP-A-62 089 365, K. Tsumenobu, "Semiconductor Device".

Third International Conference on Indium Phosphide and Related Materials, Apr. 1991, Cardiff Wales, Great Britain, pp. 238-241, S. Swirhun, et al., "P- and N-Channel InAlAs/InGaAs ...".

Solid State Technology, vol. 34, No. 11, Nov. 1991, p. 26 (FIG.), "New GaAs IC Technology".

Patent Abstracts of Japan, vol. 11 No. 130 (E-502) Apr. 23, 1987 & JP-A-61 276 269, S. Masahiko, "Hetero-Junction Type Field-Effect Transistor".

*Primary Examiner*—Rolf Hille
*Assistant Examiner*—Alexander Oscar Williams
*Attorney, Agent, or Firm*—Oblon, Spivak, McClelland, Maier & Neustadt

[57] ABSTRACT

Disclosed is a system with at least two complementary transistors, having n and p channels but comprising a heterostructure of junctions between III–V group materials. In order to balance the threshold voltages in the two channels, namely the n (2DEG) and p (2DHG) channels, at least two p and n delta doped layers are included in two layers of the heterostructure, at levels included between the channels (2DEG, 2DHG) and the gate electrodes. The n delta doped layer is then removed by localized etching right above the p channel transistor. Application to fast logic circuits.

8 Claims, 2 Drawing Sheets

SEMICONDUCTOR DEVICE WITH COMPLEMENTARY TRANSISTORS

BACKGROUND OF THE INVENTION

1. Field of the Invention

The present invention relates to a semiconductor device comprising at least two complementary type transistors formed around a heterostructure of junctions between materials of the III–V groups. One of the particular features of this device is that its structure can be used to balance the threshold voltages $V_T$ of the two transistors, which are n and p type transistors, and to optimize their mutual conductance or transconductance values, despite the differences in mobility between the electrons and the holes.

One of the objects of this device is to reduce the electrical consumption of the fast logic circuits and of the microwave circuits.

2. Description of the Prior Art

It is known that, in fast logic circuits, to date it is only n type transistors that are used because, in the channel, the electrons have far higher mobility than the holes, giving the transistors a higher cut-off frequency.

It is also known that the basic cell in logic circuits is the inverter, as shown in FIG. 1. This DCFL (Direct Coupled FET Logic) type inverter is formed by an enhanced n type input transistor 1, series-connected with a depleted n type active load 2, the entire unit being supplied between the ground and a voltage $V_{DD}$. The input signal is applied at I on the gate of the transistor 1 and the output signal is collected at O on the drain of the same transistor. The power consumed (0.3, 1 mW) by this basic inverter:

$$P \simeq V_{DD}\frac{I_1}{2} + kf$$

is proportional to the working frequency (kf) but comprises a constant term corresponding to the consumption of the active load 2, even if the inverter is idle.

The use of a BFL (Buffered Fet Logic) inverter is even more characteristic for, apart from the fact that the transistors are all depletion transistors, the inverter of FIG. 1 is followed by a shifting stage which also consumes power in the idle state, which means that the power consumed is of the order of 5 to 10 mW.

Furthermore, it is known that complementary MOS transistors, on silicon, have the advantage of zero consumption when idle and have consumption proportional to the frequency (kf) when working. This is why, for fast logic systems (corresponding to operation at microwave frequencies in the gigahertz range), it is desirable to have a device comparable to MOS transistors, which are presently limited to about 1 to 3 GHz.

Circuits have been made on the basis of this principle, using two HIGFET (Heterostructure Insulated Gate Fet) transistors or heterostructure field-effect transistors, one of them with one n channel and the other with one p channel. The heterostructure (i.e., by definition, one or more junctions between two or more layers of different materials of the III–V group, for example GaAs and GaInAs) is promising because it is one of the bases (among others) of the fast transistors known as TEGFETs or HEMTs (High Electron Mobility Transistors) and because HIGFETs have an excellent uniformity of threshold voltage $V_T$ on a wafer, during manufacture. This threshold voltage depends very little on the temperature and shows little sensitivity to light because it is not controlled by dopants.

A first drawback of HIGFETs, in their known structures, is that the two transistors, n and p, have different threshold voltages, in terms of absolute value, which is not suited to logic operations since the logic pulses (the bits) must have the same amplitude irrespectively of the transistor that is in operation.

A second drawback of known HIGFETs is the difference in transconductance between the two channels which is of the order of 218 mS/mm for the n channel and 28 mS/mm for the p channel, at ambient temperature in both cases. This difference can be explained notably by the low mobility of the holes $\mu_h$ at ambient temperature.

SUMMARY OF THE INVENTION

The invention proposes a new structure for a semiconductor device comprising at least two heterostructure transistors constituted by junctions between materials of the III–V group, at least one of these transistors having an n type channel, with electrons, and at least another transistor having a p type channel, with holes. This structure is characterized by the presence of a recess obtained by etching, in the region of the n channel, and by the fact that the n and p type transistors are made independently, thus enabling them to be adjusted separately.

Another object of the invention is to optimize the threshold voltages $V_{Tn}$ and $V_{Tp}$ independently, by means of at least two delta doped layers, one of which is included in the surface layer that has been spared in the etching of the recess.

Another object of the invention is to symmetrize and improve the ratio of the transconductance values.

Another object of the invention is to enable the logic ports to work at a low supply voltage $V_{DD}$ (~1 V) without any lowering of performance characteristics. This enables the logic circuit to have greater complexity without excessive consumption because the gate currents are negligible.

Another object of the invention is to have available a semiconductor device for which the method of manufacture, and in particular the selective etching, is compatible with presently used methods for the industrial-scale manufacture of field-effect transistors for VLSI circuits.

More specifically, the invention relates to a semiconductor device using complementary transistors, comprising at least two field-effect transistors made by means of a heterostructure of layers of semiconductor materials of the III–V group, at least one of these transistors having an n type channel (2DEG) and at least one other transistor having a p type channel (2DHG), these two channels being located at the same heterojunction in the heterostructure, wherein said device comprises, in two distinct layers of the heterostructure, at least two delta doped layers located between the channels (2DEG and 2DHG) and the gate metallizations of the transistors, the first of these delta doped layers being a p type layer and the second being an n type layer.

BRIEF DESCRIPTION OF THE DRAWINGS

The invention will be understood more clearly from the following description of an exemplary application, made with reference So the appended drawings, of which.

MORE DETAILED DESCRIPTION

Figure 1:
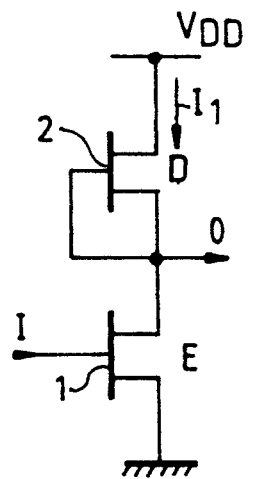
FIG. 1 shows an electrical diagram of an inverter according to the prior art.
Figure 2:
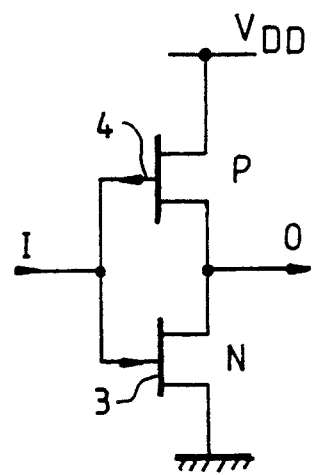
FIG. 2 shows an electrical diagram of an inverter in a complementary logic configuration that is known but is however, that of the-device according to the invention.

FIG. 2 shows the electrical diagram of an inverter, or complementary logic circuit, according to the invention: it comprises two enhanced circuits 3 and 4, series-connected between a supply $V_{DD}$ and the ground, one of the transistors 3 having an n channel and the other having a p channel. The difference between this inverter and the DCFL type inverter is that the input signal is applied simultaneously to both gates of both transistors 3 and 4. This diagram is not different from that of a complementary MOS pair: the whole difficulty is to set it up with III-V materials to make a fast logic circuit, whereas C-MOS transistors on silicon are reputed to be slow.

Indeed, if the consumption for this pair of transistors 3 and 4 is zero in static mode and proportional to the frequency in dynamic mode (kf), then there are at least two major conditions for the two types of transistors.

First of all, the threshold voltage $V_T$ should be substantially equal, in terms of absolute value, to the maximum gate-source voltage $$|V_T| \simeq 1/5 |V_{GS\,max}|$$

Figure 3:
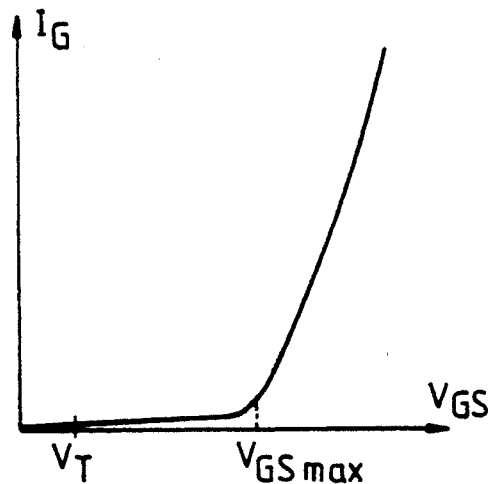
FIG. 3 shows a characteristic where $I_G = f(V_{GS})$.

The voltage $V_{GSmax}$ is shown in FIG. 3: it is of the order of 0.6 V for the MESFETs and 1 V for the TEGFETs or HEMTs. This voltage, which is dictated by the height of the barrier of the Schottky gate of a transistor, is the voltage beyond which there is a leakage of current through the gate. The maximum gate voltage pulse is limited by the gate leakage current which therefore reduces also the noise margin. Furthermore, the gate leakage current leads to a decrease in the drain saturation current, thus reducing the maximum speed of operation of the system.

The factor 1/5 is chosen arbitrarily, for the logic excursion cannot be less than $V_T$ (it has no effect on the transistor) but should not be greater than $V_{GSmax}$.

This enables a logic excursion of 4/5 $V_{GSmax}$ for each transistor (n and p) to which there corresponds a saturation current of:

$$I_{Dmax} = f(4/5\ V_{GSmax})$$

Furthermore, a second major condition is that these two threshold voltages should be substantially equal in terms of absolute value, so as to symmetrize the working of the inverter.

Another condition, which may be resolved independently, is that these two threshold voltages should be substantially equal in terms of absolute value, so as to symmetrize the working of the inverter.

Another condition, which can be resolved independently, is that the transconductance values should be substantially equal.

Figure 4:
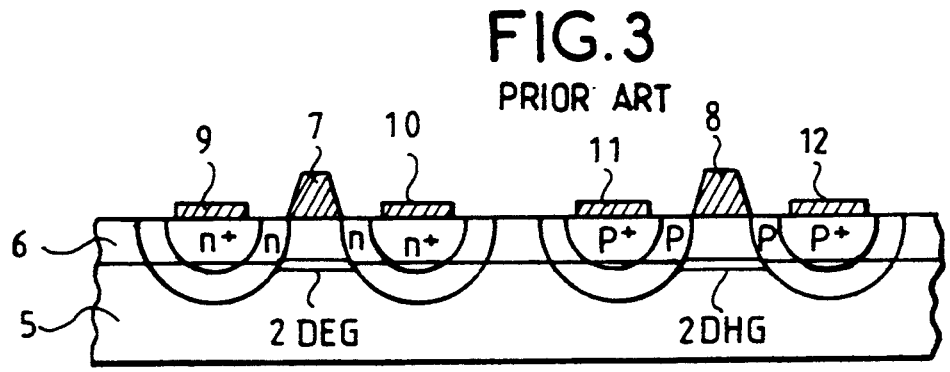
FIG. 4 shows a sectional view of an integrated circuit comprising an n type HIGFET and an p type HIGFET according to the prior art.

FIG. 4 shows a sectional view of an integrated circuit comprising an n type HIGFET and a p type HIGFET described in IEEE EDL, vol. ED1, vol. EDL 6, No. 12, December 1985, pp. 645 ff. On a substrate 5 of non-intentionally doped (nid) GaAs, a layer 6 of non-intentionally doped AlGaAs 6 is made to grow: there is therefore a heterojunction between two different semi-insulator materials. Gate metallizations 7 and 8, which are WSi refractories, are deposited before two implantations which create n doped self-aligned regions about one gate and other p doped self-aligned regions about another gate (8). Contact regions with n+ and p+ overdoping enable the deposition of the source and drain ohmic contacts 9 and 10 on the n type transistor and 11 and 12 on the p type transistor. The implantations are deep enough to reach the level of the heterojunction: therefore all the conditions have been assembled to have a 2D electron gas (2DEG) as an n channel and a 2D hole gas (2DHG) as a p channel. (The abbreviations 2DEG and 2DHG are used by convention in international scientific literature).

The drawback of this system, which is otherwise very simple, is that for the pair GaAs/Al$_x$Ga$_{1-x}$As, with x=0.3

$$V_{Tn} \simeq +0.78\ V$$

$$V_{Tp} \simeq -0.65\ V$$

If $V_{GSmax} \simeq 1$ V for an HEMT, the excursion necessary for the generation of current $V_{GSmax} - V_T \simeq 0.3/0.35$ V is low, and the logic is relatively slow.

A first improvement consists in making the 2DEG and 2DHG channels of the two transistors out of a material of the III-V group having a smaller gap than that of GaAs, for example InGaAs instead of GaAs which improves the p channel transistor:

$$V_{Tp} = -0.38\ V$$

but does not modify the n channel transistor $$V_{Tn} = +0.78\ V$$

To balance the threshold voltages and distribute the gain obtained between the two types of transistors, a second improvement provided by the invention consists in introducing front delta doped layers, i.e. between the gate and the channel.

The technique of the delta doped layer or doped plane is known per se: it consists in introducing a doping impurity (silicon or beryllium for example) during the epitaxial growth of a non-doped layer of semiconductor material localized in a film having a thickness of a few atoms, buried in a non-doped layer.

In the known cases, the single delta doped layer is a rear layer, i.e. it is between the channel and the substrate, and the threshold voltages are given by the equations:

$$V_{Tn} = \phi_m - \Delta E_c - (\sigma/\epsilon)\,d$$

$$V_{Tp} = \phi_m - \Delta E_c - g2 - (\sigma/\epsilon)d$$

in which:

$\sigma$ is the electrical charge per unit of area of the delta doped layer;

$\epsilon$ is the dielectric permittivity;

d is the distance from the channel to the gate.

It is then possible to choose the nature of the doping and the charge $\sigma$ so that the threshold voltages are equal in terms of absolute value.

$$|V_{Tn}| = |V_{Tp}| \simeq \tfrac{1}{4}V_{GSmax} \simeq 0.5V$$

but this approach leads to a low-speed operation of the logic circuit because the logic excursion $\tfrac{1}{2}V_{GSmax}$ is smaller than the desired excursion of 4/5 V $_{GSmax}$.

Increasing the supply voltage $V_{DD}$ to increase the flip-over speed of the transistor is not a suitable solution because, beyond about 1.25 V, the Schottky gate barrier is crossed and there is an increase in static consumption by leakage through the gate.

This is why the second improvement provided by the invention, referred to further above, consists in the introduction of at least two front delta doped layers, between the channel and the gate metallization, thus enabling the optimizing of the two threshold voltages $V_{Tn}$ and $V_{Tp}$ by means of two doping agents, each at the necessary doping level: these two delta doping layers are not merged in a same geometrical plane but are superimposed, thus enabling one of them to be isolated by localized etching.

Figure 5:
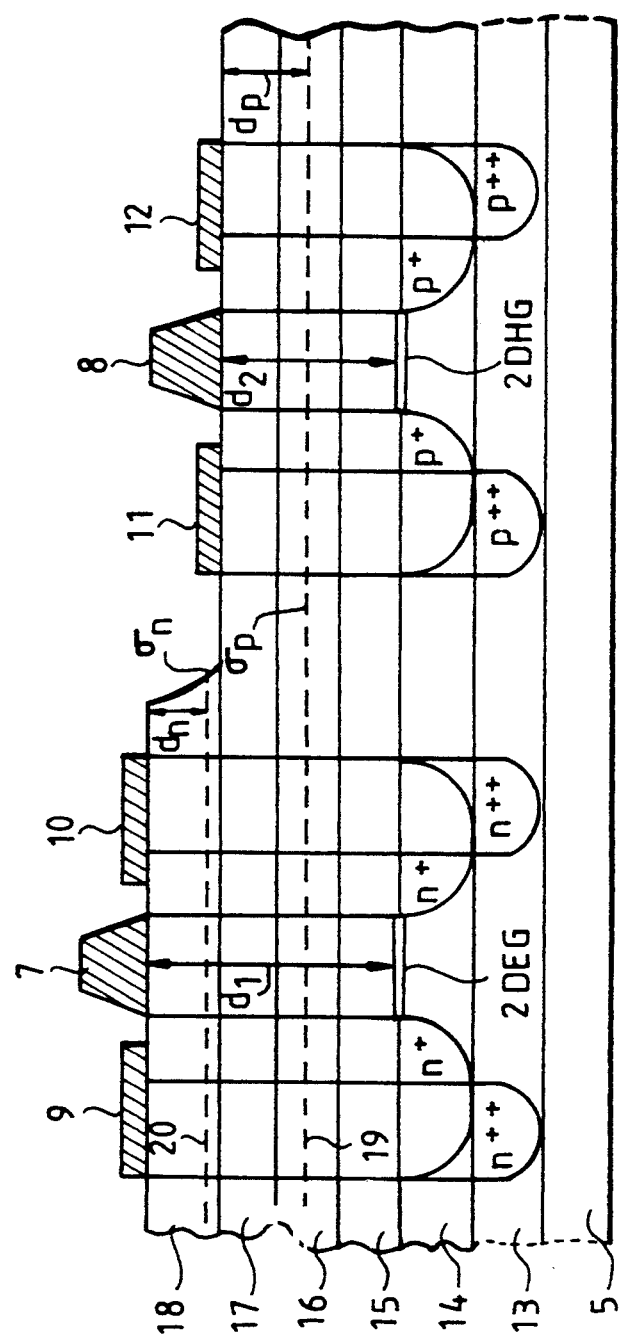
FIG. 5 shows a sectional view of an integrated circuit comprising two heterostructure transistors with n channels and p channels, according to the invention.

FIG. 5 shows a sectional view of the device with two n and p type complementary transistors according to the invention. The references common with those of the previously described transistors of FIG. 4 have been kept in this figure. The materials and the number of layers are given therein purely by way of a non-restrictive example.

On a substrate 5 made of semi-insulating GaAs, the following are made to grow successively by epitaxy:

1) a buffer layer or smoothing layer 13 made of non-intentionally doped GaAs, on a thickness of 5000 Å;

2) a layer 14 of $In_xGa_{1-x}As$ ($x \approx 0.25$), with a thickness of about 150 Å, in which there is developed either a 2DEG (electron gas) or a 2DHG (hole gas) with heterojunction with the next layer;

3) a layer 15 of $Al_xGa_{1-x}As$ ($x \approx 0.75$) on a thickness of 100 Å;

4) A GaAs layer 16, with a thickness of 50 Å, comprising a delta doped layer $\sigma_p$ which shall be referred to again further below, 5) A layer 17 of $Al_yGa_{1-y}As$ ($y \approx 0.3$) which simultaneously constitutes a barrier layer for the selective etching of GaAs and a barrier layer with a thickness of 50 Å for the p channel transistor, 6) a GaAs layer 18, with a thickness of 100 Å, comprising a delta doped layer $\sigma_n$ at 20.

After the epitaxial growth of all these layers, a selective and localized RIE etching of the layer 18 enables the elimination of the n type delta doped layer 20 above the future p type transistor, thus making $V_{Tn}$ and $V_{Tp}$ independent. This etching comes into play as soon as the manufacturing method starts.

The delta doped layer 19 is designed to adjust $V_{Tp}$. It is located approximately at mid-thickness in the GaAs layer 16, at a distance $d_p$ from the plane of the gate 8 of the p channel transistor. The charge $\sigma_p$ is set, by the dose of the delta doping, to obtain the desired $V_{Tp}$.

The delta doped layer 20 is designed to adjust $V_{Tn}$. It is located at a distance $d_{nn}$ from the plane of the gate 7 of the n channel transistor. The setting of the charge $\sigma_n$ must take account of the fact that this n channel transistor furthermore comprises the delta doped layer 19 with a charge $\sigma$.

In order to simplify FIG. 5, only two delta doped layers 19 and 20 have been shown. It is clear to those skilled in the art that each of these doping layers can be replaced by two or more layers 19a, 19b, 19c... and 20a, 20b, 20c... for the technique for this is very simple; the only condition is that all the layers of a given type should the same values of $\sigma_n d_n$ or $\sigma_p d_p$ as a single layer of theme type, 19 or 20.

The $n^+$ and $p^+$ type contact wells that adjoin the 2DEG and 2DHG channels are made by implantations with self-alignment on the gates 7 and 8 made of WSi, then the ohmic contacts 9 to 12 are deposited, according to the well-known methods for the industrial-scale manufacture of MESFETs.

The described structure, in which the n type doping layer 20 is above the p type doping layer 19, is preferable to a reverse structure. Indeed, according to the structure described, we have:

$$d_1 > d_2$$

with $d_1$ = 2DEG channel/gate 7 distance (n type transistor) $d_2$ = 2DHG channel/gate 8 distance (p type transistor)

The enables partial compensation for the mobility of the holes which is lower than the mobility of the electrons.

For the p channel transistor (2DHG) which has only one delta doped layer 19, the threshold voltage $V_{Tp}$ is defined by:

$$V_{Tp} = V^\circ{}_{Tp} + (|\sigma_p|V\epsilon)d_p$$

where $V^\circ{}_{Tp} \approx -0.38$ V is the threshold voltage without delta doped layer 19.

To obtain:

$$V_{Tp} \approx 1/5 \ V_{GS\ max} \approx -0.2V$$

which is a desired value so that the logic excursion is 4/5 V $_{GSmax}$, and with $d_p = 70$ Å (50 Å in the layer 17 + 20 Å in the layer 16), the surface density is computed $$D_p \approx 1.4 \cdot 10^{12} at.cm^{-2}$$

The delta doped layer 19 is made by Be doping.

For the n channel transistor (2DEG), with two delta doped layers 19 and 20, the threshold voltage $V_{Tn}$ is defined by:

$$V_{Tn} = V^\circ{}_{Tn} - (\sigma_n/\epsilon)d_n + (|\sigma_p|/\epsilon)d_p$$

wherein $V^\circ{}_{Tn} \approx +0.78$ V is the threshold voltage without the delta doped layers 19 and 20.

$\sigma_p$ is already determined by the computation of $V_{Tp}$: to obtain $$D_n \approx 7 \cdot 10^{12} at.cm^{-2}$$

which symmetrizes the logic inverter, and with $d_n \approx 90$ Å, it is found that:

$$V_{Tn} \approx 1/5 \ V_{GS\ max} \approx +0.2 \ V$$

The doped layer 20 is made by means of Si.

Thus, the use of two front delta doped layers, i.e. layers located between the gate and the channel, conjugated with a selective etching that partially eliminates one of these doping layers, enables the making of an inverter with complementary field-effect transistors, made of III–V type materials for fast logic operation. Indeed, the elimination, by etching, of one of the two delta doped layers enables the independent optimizing of the two threshold voltages as well as the independent optimizing of the transconductance $g_m$ of the two transistors.

These transistors can work with a low supply voltage $V_{DD}$ (~1 V) without deterioration of the performance characteristics, because $V_{GS}\text{max} < 1$ V has been chosen. The low threshold voltages permit high logic excursion, the result of which is that the transistor has a capacity to give more current during the transients, and high performance characteristics during changes in state: $T_{pd} < 50$ ps.

The invention has been described with reference to an example in which the compositions and the thicknesses of the layers are mentioned solely in order to simplify the explanation. It is clear that the device according to the invention can be made with any of the compounds of the III–V group (Al, Ga, In, P, As) in the form of binary, ternary or quaternary alloys, if these compounds form two n channel and p channel heterojunction transistors, comprising at least two "front" delta doped layers, according to the spirit of the invention, which is specified in the following claims.

What is claimed is:

1. A semiconductor device using complementary transistors, comprising at least two field-effect transistors made by means of a heterostructure of layers of semiconductor materials of the III–V group, at least one of said transistors having an n type 2DEG channel and at least one other of said transistors having a p type 2DHG channel, said two channels being located at the same heterojunction in the heterostructure, wherein said device further includes, in two distinct layers of the heterostructure, for each of said transistors, a delta doped layer, said delta doped layer of each transistor being located between the channel of the transistor and the gate metallization of the transistor, a first of the delta doped layers being a p type layer and a second being an n type layer.

2. A device with complementary transistors according to claim 1 wherein, in the heterostructure, the first p type delta doped layer is located between the second n type delta doped layer and the heterojunction that contains the two channels.

3. A device with complementary transistors according to claim 2, wherein the second delta doped layer is located in the surface layer of the heterostructure and wherein said second delta doped layer is removed locally, right above the p channel transistor by localized selective etching of said surface layer.

4. A device with complementary transistors according to claim 3, wherein the doping level, $\sigma_p$, of the first delta doped layer controls the threshold voltage $V_{Tp}$ of the p channel transistor.

5. A device with complementary transistors according to claim 3, wherein the doping level, $\sigma_n$, of the second delta doped layer controls the threshold voltage $V_{Tn}$ of the n channel transistor, given the doping level, $\sigma_p$, of the first delta doped layer.

6. A device with complementary transistors according to claim 4 or 5, wherein the threshold voltages $V_{Tn}$ and $V_{Tp}$ of the two types of transistors are substantially equal in terms of absolute value, and are computed to be of the order of 1/5 $V_{GSmax}$, the maximum gate/source voltage.

7. A device with complementary transistors according to claim 3, wherein the distance $d_1$ between the channel and the gate is, for the n channel transistor, greater than the distance $d_2$ between the channel and the gate for the p channel transistor.

8. Device with complementary transistors according to claim 1, wherein the heterostructure of group III–V semiconductor material comprises in the following order:

a substrate made of a first GaAs type semi-insulator material, covered with a buffer layer of non-intentionally doped first GaAs type semi-insulator material;

a layer of second material, of the InGaAs type, forming said heterojunction containing said n type channel and said p type channel with a layer of a third material, of the AlGaAs type;

a layer of the first material, GaAs, comprising the first delta doped layer of the p type;

a barrier layer, of the third material, AlGaAs, which is a barrier to a localized selective etching;

a surface layer of the first material, GaAs, comprising the second delta doped layer of the n type.

* * * * *

UNITED STATES PATENT AND TRADEMARK OFFICE
CERTIFICATE OF CORRECTION

PATENT NO. : 5,367,183
DATED : November 22, 1994
INVENTOR(S) : Ernesto PEREA, et al.

It is certified that error appears in the above-indentified patent and that said Letters Patent is hereby corrected as shown below:

On the title page, Item [21], the Application Number should read:

--43,553--

Also on the title page, Item [19], the first inventor's last name should read:

--Perea et al.--

Signed and Sealed this

Seventh Day of March, 1995

Attest:

BRUCE LEHMAN

Attesting Officer        Commissioner of Patents and Trademarks